(12) United States Patent
Bodano et al.

(10) Patent No.: US 7,569,903 B2
(45) Date of Patent: Aug. 4, 2009

(54) COMPONENT ARRANGEMENT HAVING A TRANSISTOR AND AN OPEN-LOAD DETECTOR

(75) Inventors: Emanuele Bodano, Padova (IT); Nicola Macri, Vincenza (IT)

(73) Assignee: Infineon Technologies Austria AG, Villach (AT)

( * ) Notice: Subject to any disclaimer, the term of this patent is extended or adjusted under 35 U.S.C. 154(b) by 497 days.

(21) Appl. No.: 11/369,279

(22) Filed: Mar. 7, 2006

(65) Prior Publication Data

US 2006/0267680 A1      Nov. 30, 2006

(30) Foreign Application Priority Data

Mar. 7, 2005     (DE) ................ 10 2005 010 337

(51) Int. Cl.
*H01L 29/82* (2006.01)
*H01L 43/00* (2006.01)

(52) U.S. Cl. .................. 257/423; 257/511; 257/525; 257/E27.023; 257/E27.043

(58) Field of Classification Search ............. 257/423, 257/511, 525, E27.023, E27.043, 474, 477, 257/517, 556, 575
See application file for complete search history.

(56) References Cited

U.S. PATENT DOCUMENTS 5,438,286 A     8/1995    Pavlin et al.

FOREIGN PATENT DOCUMENTS

DE      195 20 735 A1     12/1996
DE      101 30 081 A1     6/2002

OTHER PUBLICATIONS

Infineon Technologies AG, "5-V Voltage Regulator," Data Sheet TLE 4287 G, Rev. 1.3, Jan. 1, 2004, pp. 1-12 (2004).

*Primary Examiner*—Hoai v Pham
(74) *Attorney, Agent, or Firm*—Dicke, Billig & Czaja P.L.L.C.

(57) ABSTRACT

One embodiment of the invention relates to a component arrangement including a load and an open-load detector. The load transistor has a first transistor region arranged in a semiconductor body, a second transistor region arranged in the semiconductor body and a third transistor region arranged between the first transistor region and the second transistor region and doped in complementary fashion to the first transistor region and the second transistor region. The open-load detector has a sense region arranged in the third transistor region and of conduction type complementary to the third transistor region and having an evaluation circuit connected to the sense region.

17 Claims, 3 Drawing Sheets

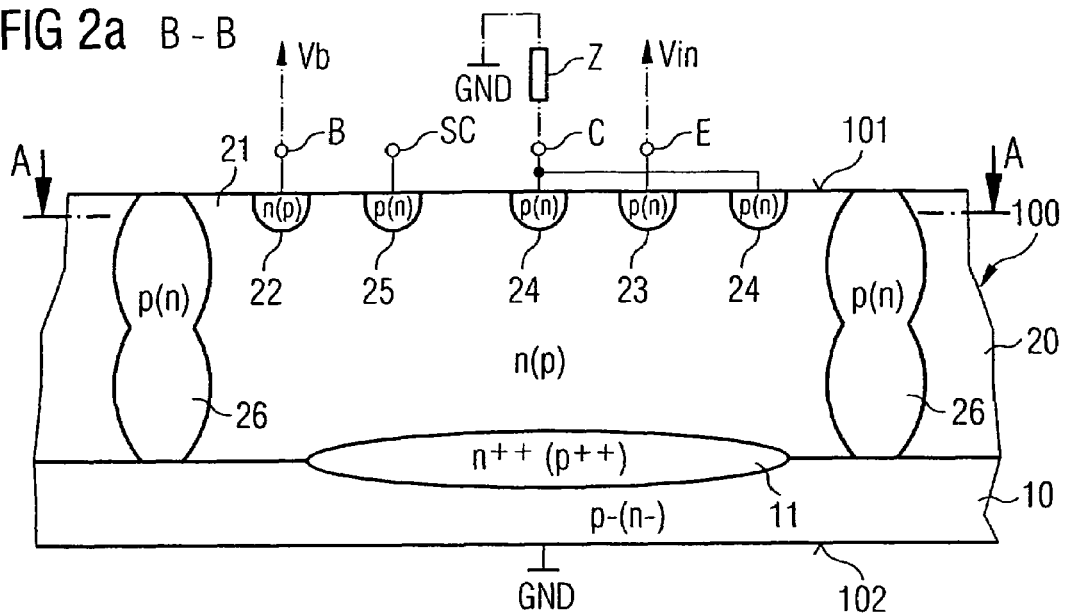
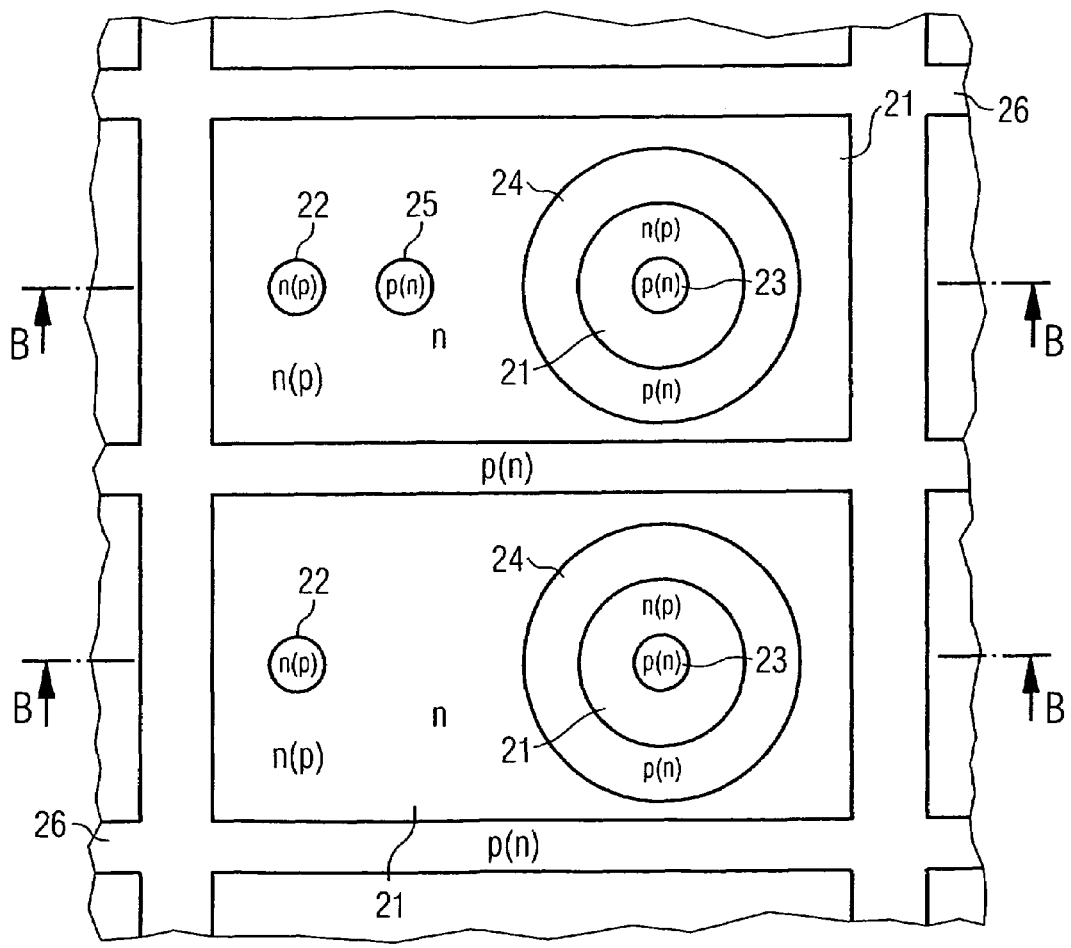

COMPONENT ARRANGEMENT HAVING A TRANSISTOR AND AN OPEN-LOAD DETECTOR

CROSS-REFERENCE TO RELATED APPLICATIONS

This Utility Patent Application claims priority to German Patent Application No. DE 10 2005 010 337.5, filed on Mar. 7, 2005, which is incorporated herein by reference.

BACKGROUND

One embodiment of the present invention relates to a component arrangement having a transistor and an open-load detector.

FIG. 1 illustrates a circuit arrangement having a transistor T and a load Z connected in series with a load path of the transistor.

The function of transistor T is governed by a control circuit CC connected to its control contact. Thus transistor T can serve as a simple switching element for connecting load Z to an input voltage Vin imposed across the series circuit of transistor T and load Z. Control circuit CC in this case is adapted to turn the switch, as selected, on in order to connect the load to input voltage Vin, or off. The transistor can also be part of a linear voltage controller that converts input voltage Vin imposed across the series circuit of transistor T and the load into a controlled output voltage Vout in order to supply the load. Such a linear voltage controller is described, for example, in data sheet TLE4287G, Rev. 1.3, 2004-01-01, of Infineon Technologies AG, Munich.

If, with transistor T being turned on, an open load occurs, that is, if the connection between transistor T and load Z is interrupted, then transistor T or any further circuit components (not illustrated) connected to the transistor may be damaged. The detection of such an open load is an important consideration for circuit arrangements having a transistor connectable in series with a load.

An example of a practice followed in order to detect an interruption of the connection between a transistor and a load, referred to as "load connection" in what follows, might be continuous sensing of a transistor output current flowing through the load and comparison thereof with a reference current. An interruption of the load connection would then be inferred if output current Iout fell below the reference current. The output current could be determined, for example, with a sensing arrangement functioning according to the "current sense" principle. Such a sensing arrangement is described, for example, in DE 195 20 735 A1. This procedure has the disadvantage of the substantial cost of the circuit necessary for the sensing arrangement and for a circuit for generating the reference current. Furthermore, in a current-sensing arrangement working according to the current sense principle, a sense current proportional to the load current flows continuously, thus increasing the power loss of the arrangement.

Furthermore, in order to interrupt the load connection, the output voltage present across the load could be continuously compared with a reference voltage, an open load being inferred if the output voltage exceeds the value of the reference voltage. This approach also entails a substantial cost for the circuit for implementing the reference voltage source and for implementing a suitable comparator arrangement. A circuit arrangement for detecting an open load functioning according to this principle is described, for example, in U.S. Pat. No. 5,438,286.

SUMMARY

One embodiment of the present invention provides a circuit arrangement having a transistor and an open-load detector wherein the open-load detector can be implemented in space-saving fashion and at a low circuit cost.

In one embodiment, the component arrangement includes a load transistor having a first transistor region arranged in a semiconductor body, a second transistor region arranged in the semiconductor body and a third transistor region arranged between the first transistor region and the second transistor region. This third transistor region is doped in complementary fashion to the first transistor region and the second transistor region.

The load transistor is in one case a bipolar transistor. The third transistor region then forms the base region of this transistor, and the first and second transistor regions form the emitter and collector regions of this transistor.

One embodiment of the component arrangement further includes an open-load detector having a sense region, of conduction type complementary to the third transistor region, arranged in the third transistor region and having an evaluation circuit connected to the sense region.

The sense region is in one case arranged in the semiconductor body some distance away from the first transistor region, the distance between the first transistor region and the sense region being greater than the distance between the first transistor region and the second transistor region. With the first transistor region and the third transistor region of the load transistor, the sense region forms a further transistor. This further transistor, because of the spatial arrangement of the sense region relative to the first transistor region of the load transistor, conducting a current substantially only when an open load occurs, as will be further explained in what follows.

The evaluation circuit connected to the sense region is in one case adapted to detect a current flowing into the sense region or flowing out of the sense region.

The evaluation circuit connected to the sense region is in one case at least partly integrated into the same semiconductor body as the transistor and the sense region.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 2a illustrates cross sections through a semiconductor body, in which there are transistor regions of a bipolar transistor and a sense region in a first section plane.

FIG. 2b illustrates cross sections through a semiconductor body, in which there are transistor regions of a bipolar transistor and a sense region in a second section plane.

DETAILED DESCRIPTION

Figure 1:
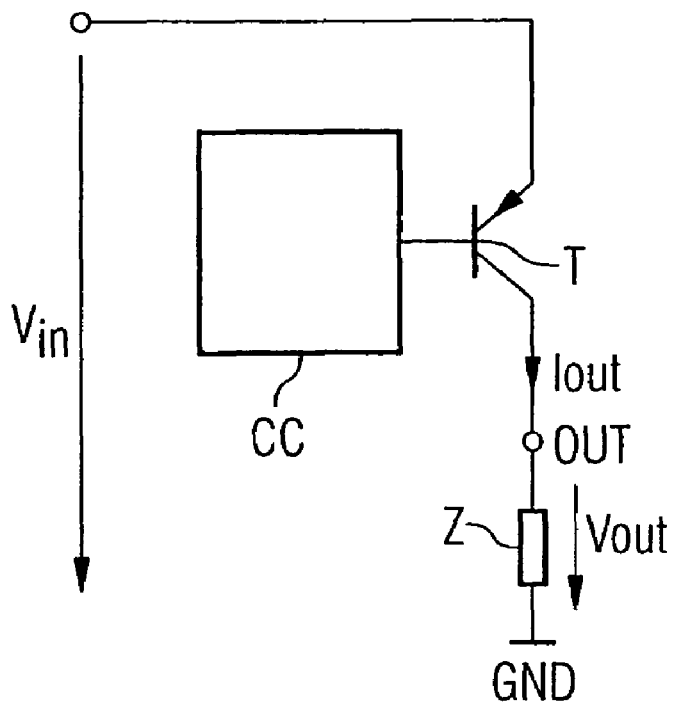
FIG. 1 illustrates a series circuit of a transistor and a load according to the prior art.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Referring to FIG. 2, one aspect of the arrangement according to one embodiment of the invention, which has a load transistor and an open-load detector, consists in arranging a sense region 25, which is part of the open-load detector, in the same semiconductor body 100 as transistor regions 22-23 of the load transistor. FIG. 2a illustrates a cross section through semiconductor body 100 with transistor regions 22-23 arranged therein and sense region 25, in a first section plane B-B, and FIG. 2b illustrates semiconductor body 100 in cross section in a second section plane A-A perpendicular to first section plane B-B.

Semiconductor body 100, in the example, has a first semiconductor layer 10 of a first conduction type, for example a semiconductor substrate, and a second semiconductor layer 20 of a second conduction type, for example an epitaxial layer, emplaced on first semiconductor layer 10. First semiconductor layer 10, in the example, forms a back side of semiconductor body 100, while second semiconductor layer 20 forms its front side 101.

The transistor of the component arrangement, in the example according to FIG. 2, is fashioned as a bipolar transistor. To this end, in second semiconductor layer 20, in the region of front side 101, there are arranged first and second transistor regions 23, 24, which are doped in complementary fashion to second semiconductor layer 20 and form the emitter region 23 and the collector region 24 of the bipolar transistor. In the example, emitter region 23 and collector region 24 are fashioned so that collector region 24 encloses emitter region 23 in annular fashion in semiconductor body 100. Arranged between emitter region 23 and collector region 24 is a doped semiconductor region 21, which forms a third transistor region, in the example the base region of the bipolar transistor. The doping of this base region 21 can be the same as the principal doping of semiconductor layer 20.

For the imposition of an electric potential on base region 21, this region has a more strongly doped contact region 22 of the same conduction type. In FIG. 2a the reference character B denotes the base contact of the transistor, E the emitter contact of the transistor and C the collector contact of the transistor. These contacts are merely illustrated schematically in FIG. 2a as conductive connections to the respective transistor regions.

Base region 21 is n-doped in the case of a pnp bipolar transistor and p-doped in the case of an npn bipolar transistor. Correspondingly, emitter and collector regions 23, 24 are p-doped in the case of a pnp bipolar transistor and n-doped in the case of an npn bipolar transistor.

Arranged in base region 21 a distance away from emitter region 23 and collector region 24 is a sense region 25, which is doped in complementary fashion to base region 21. This sense region 25, in the example, is arranged spatially between base contact region 22 and emitter and collector regions 23, 24. Sense region 25 is then arranged in such a way that a spatial distance between sense region 25 and emitter region 23 is greater than a spatial distance between emitter region 23 and collector region 24.

In what follows, the mode of functioning of the arrangement with the transistor regions and the sense region is explained for a hookup of the bipolar transistor with a load Z as illustrated schematically in FIG. 2a. The bipolar transistor in this example is hooked up as a high-side switch for controlling load Z. Here emitter contact E is connected to a positive supply potential Vin and collector contact C is connected, via a load Z, to a negative supply potential or reference potential GND. In order to turn the bipolar transistor on, a suitable control potential is imposed on base contact B, which control potential, in the case of a pnp bipolar transistor, must be less than the potential at emitter contact E by at least the value of the cutoff voltage of the bipolar transistor and, in the case of an npn bipolar transistor, must be greater than the potential at emitter contact E by at least the value of the cutoff voltage.

When the bipolar transistor is on, a current flows via the emitter-collector path of the bipolar transistor and load Z toward reference potential GND. Sense region 25, with base region 21 and emitter region 23, forms a further bipolar transistor, referred to as "sense transistor" in what follows. A current gain $\beta$ of this sense transistor, however, is substantially lower than a current gain $\beta$ of the load transistor formed by emitter region 23, collector region 24 and base region 21. The reason for this lower current gain of the sense transistor is that sense region 25 is arranged farther away from emitter region 23 than is collector region 24 and that, furthermore, collector region 24 is arranged laterally between emitter region 23 and sense region 25. When load Z is properly connected, charge carriers injected into base 21 by emitter region 23 at the imposed supply voltage Vin are largely absorbed by collector region 24, so that hardly any charge carriers reach sense region 25. Even if load Z is properly hooked up, only a negligible current will flow through sense region 25 when the sense region is connected to reference potential GND via its contact SC, referred to as "sense collector" in what follows.

The situation is different if, the load transistor being turned on and supply voltage Vin being imposed, the load connection is interrupted. In this case, the potential of collector region 24 rises to approximately the value of supply voltage Vin and the component goes into saturation, that is, base 21 is flooded with charge carriers (holes in the case of a pnp transistor, electrons in the case of an npn transistor) from emitter 23. Because these charge carriers are no longer absorbed by collector 24, charge carriers reach sense region 25 in a not insignificant quantity so that, in the case of an open load, a sense current indicating the open load is detectable at sense region 25 by means of a suitable evaluation circuit, which is yet to be explained with reference to FIG. 4 and FIG. 5.

Base region 21 with collector and emitter regions 24, 23 arranged therein and sense region 25 is, in the example, enclosed in annular fashion by a semiconductor region 26, which is doped in complementary fashion to base region 21 or in complementary fashion to the principal doping of the second semiconductor layer and, by a p-n junction, isolates base region 21 from further regions of semiconductor layer 20. This semiconductor region 26 extends from front side 101 to semiconductor substrate 10.

Semiconductor substrate 10, which is doped in complementary fashion to base 21, usually lies at the lowest potential present in the circuit in which the load transistor is employed. This potential, for the previously explained circuit application, is equal for example to reference potential GND. With base 21 and emitter region 23, semiconductor substrate 10 forms a further bipolar transistor. The current gain of this further bipolar transistor is greatly weakened by a comparatively large distance between emitter region 23 and substrate 10 and also by a strongly doped semiconductor region 11, which is doped in complementary fashion to substrate 10 and is arranged between base 21 and substrate 10. During normal operation, that is, when the load is properly connected, approximately no current thus flows through this parasitic bipolar transistor. In case of an open load, a current can flow through this parasitic bipolar transistor, this current usually being much smaller than a current flowing through sense transistor 25 because of strongly doped semiconductor layer 11.

The bipolar transistor can, for example, be structured in cellular fashion, that is, there can be a multiplicity of the component structures illustrated in FIG. 2, each having a base region 21, an emitter region 23 and a collector region 24 enclosed by a pn isolating region 26. The individual transistor cells, each of which performs the function of a transistor on its own, are thus connected in parallel, that is, the base regions in each case are electrically conductively connected to one another, the emitter regions in each case are electrically conductively connected to one another and the collector regions in each case are electrically conductively connected to one another. Two such transistor cells, one of which has a sense region, are illustrated in FIG. 2b. The at least one sense region is preferably arranged in a transistor cell that is located at the edge of a cell array formed by the transistor cells.

In order that an open load can be detected, it is sufficient here if there is a sense region 25 for at least one of these transistor cells.

Figure 3:
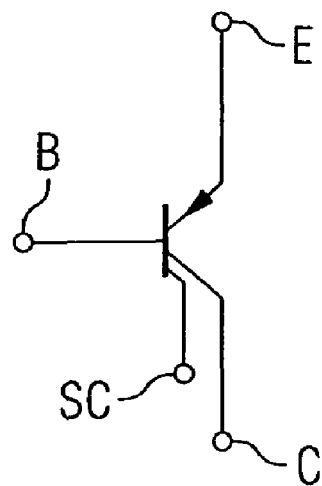
FIG. 3 illustrates an electric circuit symbol of the component illustrated in FIG. 2 with the transistor regions and the sense region.

FIG. 3 illustrates the circuit symbol of the arrangement illustrated in FIG. 2 with load transistor T and the sense region arranged in the base of the load transistor. This circuit symbol is formed as the circuit symbol of a bipolar transistor having an additional collector contact (sense collector) SC, which is formed by sense region 25 in FIG. 2. The circuit symbol does not take account of the fact that the current gain for the current path from the emitter to "sense collector" SC is substantially lower than the current path from the emitter to collector C.

Figure 4:
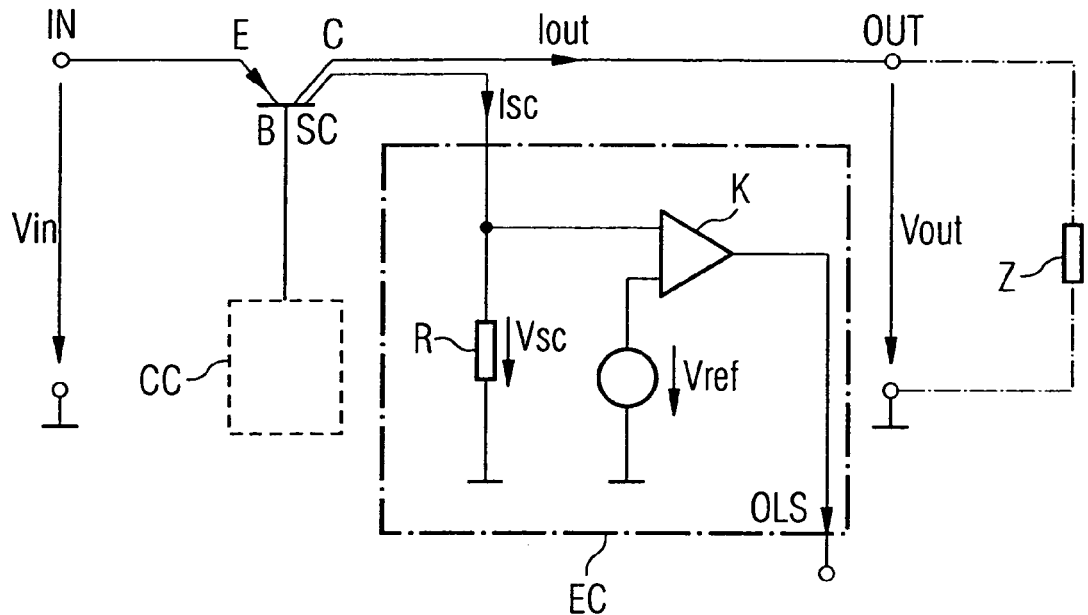
FIG. 4 illustrates the equivalent electric circuit diagram of a component arrangement according to one embodiment of the invention.

FIG. 4 illustrates the circuit diagram of a component arrangement according to one embodiment of the invention having an open-load detector with an evaluation circuit EC connected to sense collector SC. This evaluation circuit EC furnishes an open-load signal OLS. Open-load signal OLS is in one case a binary signal that takes on a first state if an open load is detected and a second state in the case of normal operation.

In the example, evaluation circuit EC includes a resistance R connected between sense collector SC and a supply potential, in the example reference potential GND. A comparator K compares a sense voltage Vsc present across resistance R with a reference voltage Vref in order, in dependence on this comparison, to furnish open-load signal OLS, which is present at the output of comparator K. Reference voltage Vref is matched to the value of resistance R and a sense current Isc that can be picked off at sense collector SC in such a way that sense current Isc in the case of normal operation is not sufficient to bring about a voltage drop greater than reference voltage Vref across resistance R.

Figure 5:
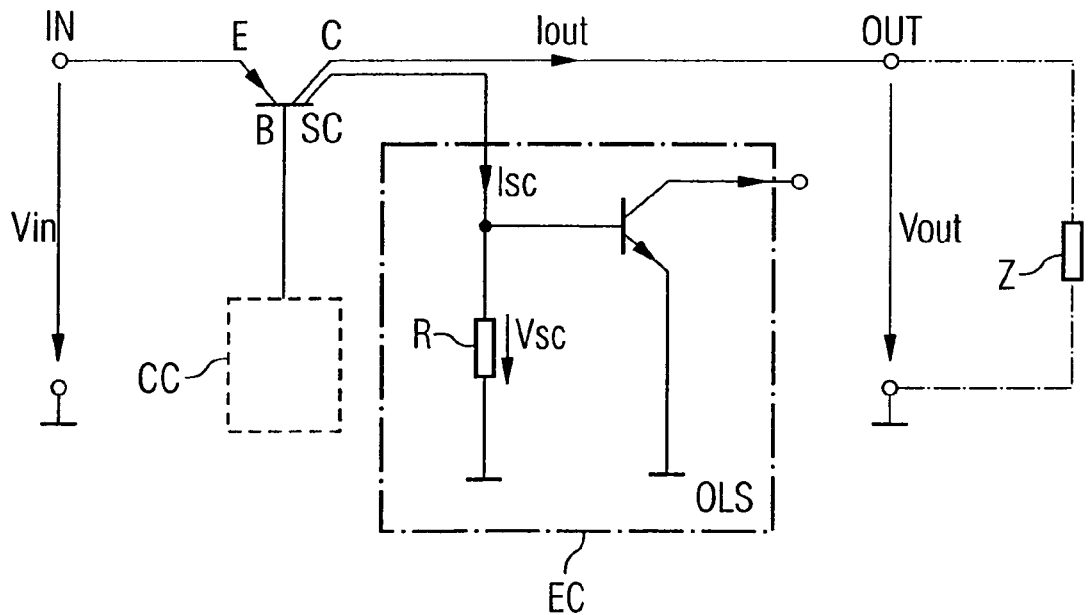
FIG. 5 illustrates the equivalent electric circuit diagram of a component arrangement according to another embodiment of the invention.

FIG. 5 illustrates a further exemplary embodiment of evaluation circuit EC wherein, in place of comparator K and reference voltage source Vref, there is only a bipolar transistor, in the example an npn bipolar transistor T2. Voltage Vsc imposed across resistance R here controls the base-emitter path of this bipolar transistor T2. In the example, open-load signal OLS can be picked off at collector contact K of bipolar transistor T2. Signal OLS takes on a low level in this example when voltage drop Vsc across resistance R is sufficient to turn on transistor T2. Resistance R here is matched to the cutoff voltage of transistor t2 in such a way that voltage drop Vsc exceeds the cutoff voltage of bipolar transistor T2 only if a sense current Isc sufficiently high to indicate an open load can be picked off at sense collector SC.

The evaluation circuit is in one case at least partly integrated into the same semiconductor body in which the transistor regions of the load transistor are arranged.

Open-load signal OLS indicates an open load if, with load transistor T turned on, output current Iout falls below a specified threshold. In what follows, the determination of this threshold is explained with reference to an example. Suppose the load transistor is structured in cellular fashion from N identical transistor cells, each of which supplies a current Ic1 when the transistor is turned on, so that the total current Iout is given by $$Iout = N \cdot Ic1 \qquad (1)$$

Suppose further that the ratio of load-current fraction Ic1 of a cell to sense current Isc flowing through the sense collector of a cell in the case of an open load is given by $$Isc1 = K \cdot Ic1 \qquad (2)$$

Here Isc1 represents the fraction of the load current of a cell that is delivered via the sense collector in the case of an open load. The proportionality factor K here is less than unity.

If sense regions are present in only M transistor cells, then total sense current Isc is given by $$Isc = M \cdot Isc1 = M \cdot K \cdot Ic1 = M \cdot K \cdot Iout/N \qquad (3)$$

Suppose, moreover, that open-load signal OLS takes on a level indicating an open load when the voltage across resistance R rises to the value of a threshold voltage Vref. In what follows, let Iout_th denote a current threshold below which output current Iout must fall, in the case of transistor T being turned on and a (partial) open load being present, so that an open load is indicated. This threshold value is given by $$Iout\_th = (Vref/R)/(M \cdot K/N) \qquad (4)$$

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A component arrangement comprising:
a load transistor, the load transistor further comprising:
a first transistor region arranged in a semiconductor body;
a second transistor region arranged in the semiconductor body; and
a third transistor region arranged between the first transistor region and the second transistor region and doped in complementary fashion to the first transistor region and the second transistor region; and
an open-load detector having a sense region arranged in the third transistor region and of conduction type complementary to the third transistor region and having an evaluation circuit connected to the sense region.

2. The component arrangement of claim 1, wherein the sense region is arranged in the semiconductor body a distance away from the first transistor region and wherein the second transistor region is arranged a distance away from the first transistor region, the distance between the first transistor region and the sense region being greater than the distance between the first transistor region and the second transistor region.

3. The component arrangement of claim 1, wherein the evaluation circuit has a resistance element connected between the sense region and a terminal for a first potential and has a comparator circuit connected to the resistance element, and wherein the comparator circuit furnishes an open-load signal.

4. The component arrangement of claim 3, wherein the comparator circuit further comprises:
a reference voltage source that furnishes a reference voltage; and
a comparator having a first input and a second input and an output, of which one input is connected to the resistance element, the reference voltage is supplied to the other input, and the open-load signal is available at its output.

5. The component arrangement of claim 3, wherein the comparator circuit has a further transistor with a control contact and a first load contact and a second load contact, of which the control contact is connected to the resistance element and the open-load signal can be picked off at its first load contact.

6. The component arrangement of claim 1, wherein the load transistor is fashioned as a bipolar transistor whose base region is formed by the third transistor region and whose emitter region and collector region are each formed by one of the first and second transistor regions.

7. The component arrangement of claim 1, wherein the load-detector circuit is at least partly integrated into the same semiconductor body as the load transistor.

8. The component arrangement of claim 1, wherein the load transistor has a multiplicity of identically structured transistor cells connected in parallel, each having a first transistor region, a second transistor region and a third transistor region, at least one of the transistor cells having a sense region.

9. A component arrangement comprising:
a first and a second transistor region arranged on a semiconductor body;
a third transistor region arranged between the first and second transistor regions and doped in a complementary fashion to the first and second transistor regions, the first, second, and third regions collectively forming a load transistor;
a sense region arranged in the third transistor region and of a conduction type complementary to the third transistor region; and
means coupled to the sense region for providing an open-load signal.

10. The component arrangement of claim 9, further comprising an open-load detector including the sense region and an evaluation circuit connected to the sense region.

11. The component arrangement of claim 10, wherein the evaluation circuit has a resistance element connected between the sense region and a terminal for a first potential and has a comparator circuit connected to the resistance element, and wherein the comparator circuit furnishes the open-load signal.

12. The component arrangement of claim 11, wherein the comparator circuit further comprises:
a reference voltage source that furnishes a reference voltage; and
a comparator having a first input and a second input and an output, of which one input is connected to the resistance element, the reference voltage is supplied to the other input, and the open-load signal is available at its output.

13. The component arrangement of claim 11, wherein the comparator circuit has a further transistor with a control contact and a first load contact and a second load contact, of which the control contact is connected to the resistance element and the open-load signal can be picked off at its first load contact.

14. The component arrangement of claim 10, wherein the open-load detector is at least partially integrated into the same semiconductor body as the load transistor.

15. The component arrangement of claim 9, wherein the sense region is arranged in the semiconductor body a distance away from the first transistor region and wherein the second transistor region is arranged a distance away from the first transistor region, the distance between the first transistor region and the sense region being greater than the distance between the first transistor region and the second transistor region.

16. The component arrangement of claim 9, wherein the load transistor is fashioned as a bipolar transistor whose base region is formed by the third transistor region and whose emitter region and collector region are each formed by one of the first and second transistor regions.

17. The component arrangement of claim 9, wherein the load transistor has a multiplicity of identically structured transistor cells connected in parallel, each having a first transistor region, a second transistor region and a third transistor region, at least one of the transistor cells having a sense region.

* * * * *